United States Patent
Van de Walle

[11] Patent Number: 6,121,639
[45] Date of Patent: Sep. 19, 2000

[54] OPTOELECTRONIC DEVICES BASED ON ZNGEN$_2$ INTEGRATED WITH GROUP III-V NITRIDES

[75] Inventor: Christian Gilbert Van de Walle, Sunnyvale, Calif.

[73] Assignee: Xerox Corporation, Stamford, Conn.

[21] Appl. No.: 09/137,112

[22] Filed: Aug. 20, 1998

[51] Int. Cl.$^7$ .................................................. H01L 33/00
[52] U.S. Cl. .............................. 257/103; 257/94; 257/96; 257/200; 257/613; 257/615; 257/616; 438/27; 438/29; 438/46; 438/47; 372/44; 372/45
[58] Field of Search ............................... 257/103, 76, 78, 257/79, 96, 97, 200, 613, 616; 372/44, 45; 438/22, 27, 29, 46, 47

[56] References Cited

U.S. PATENT DOCUMENTS

| | | | |
|---|---|---|---|
| 3,875,451 | 4/1975 | Bachmann et al. | 313/498 |
| 4,315,796 | 2/1982 | Nishizawa | 156/614 |
| 4,430,188 | 2/1984 | Cohn | 204/290 |
| 4,695,432 | 9/1987 | Colin et al. | 422/98 |

OTHER PUBLICATIONS

Maunaye et al., Preparation and Properties of ZnGeN2, Mat. Res. Bull., vol. 5, pp. 793–796, 1970.
Knights et al., High Power Diode Pumped Mid–IR Lasers, Lasers and Electro–Optics Society Annual Meeting, 1993, LEOS '93 Conference Proceedings, IEEE, p. 691, Nov. 1993.

Xing et al., Substrate effects in the epitaxial growth of ZnGeP2 thin films by open tube organometallic chemical vapor deposition, J. Appl. Phys. 69 (8), pp 42864291, Apr. 1991.

Dietz et al., Native defect related optical properties of ZnGeP2, Appl. Phys. Lett. 65 (22), pp. 2759–2761, Nov. 1994.

Hopkins et al., Nonlinear Optical Crystal Development at the USAF Wright Laboratory, pp. 914–921.

*Primary Examiner*—Jerome Jackson, Jr.
*Assistant Examiner*—Bradley William Baumeister
*Attorney, Agent, or Firm*—Oliff & Berridge, PLC

[57] ABSTRACT

Group III-V nitride semiconductors are used as light emitters for other optoelectronic devices. To provide the desired range of bandgap and band offsets in heterostructure devices, InGaN layers have to be grown. InGaN layers are difficult to grow because of lattice mismatch with GaN, and because of problems with homogeneity. Thus, ZnGeN$_2$ is provided as the active layer in a blue or blue-green light-emitting device. ZnGeN$_2$ has a bandgap in the blue region of the spectrum and is almost lattice matched to GaN, making it an ideal candidate for integration with group III-V nitrides.

31 Claims, 6 Drawing Sheets

OPTOELECTRONIC DEVICES BASED ON ZNGEN$_2$ INTEGRATED WITH GROUP III-V NITRIDES

BACKGROUND OF THE INVENTION

1. Field of Invention

The invention relates to the field of semiconductors. More particularly, the invention is directed to nitride semiconductor films for use in blue light emitting devices.

2. Description of Related Art

Semiconductor light emitters have many applications: light-emitting diodes (LEDs) are used, for instance, for displays and lighting applications; laser diodes (LDs), which emit coherent light, are used in telecommunications, data storage, and for printing.

Figure 1:
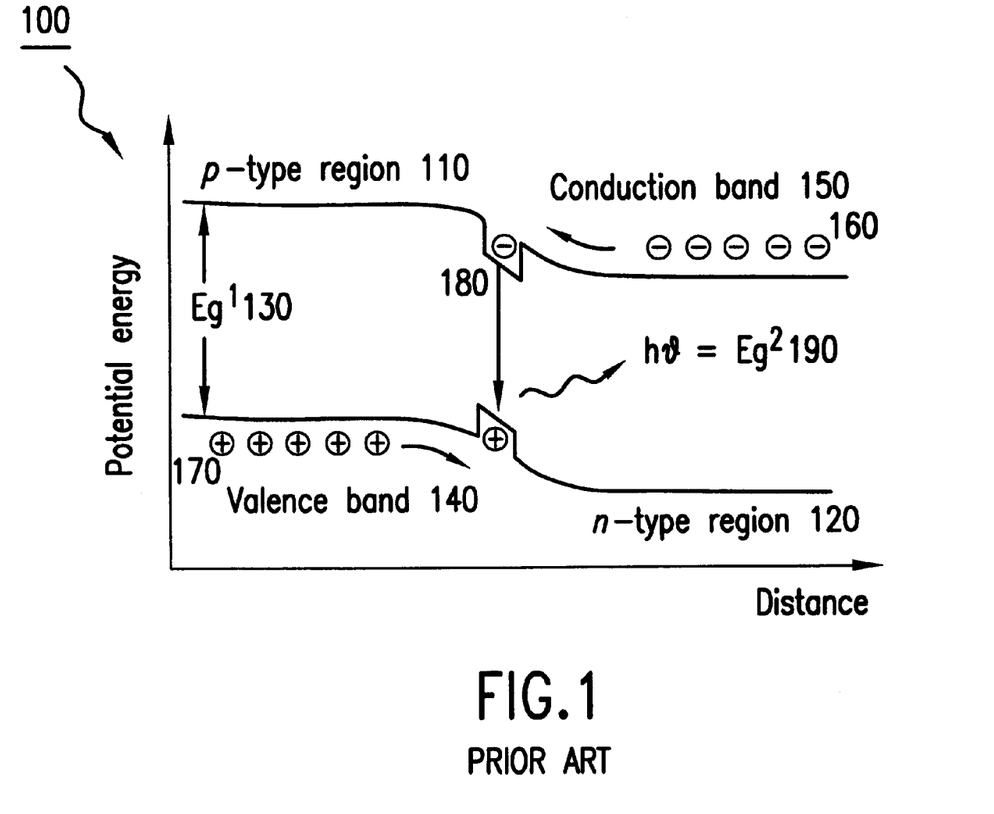
FIG. 1 shows a conventional p-n junction double-heterostructure device.

These devices emit light when a current passes through a pn-junction. As shown in FIG. 1, the diode 100 includes a sandwich of a p-type 110 semiconductor material and an n-type 120 semiconductor material. These materials are characterized by a bandgap $E_g^1$ 130. The bandgap 130 is the energy difference between the valence band 140 and the conduction band 150. The bandgap determines the energy of a photon produced when an electron in the conduction band recombines with a hole in the valence band. When current passes through the diode 100, the electrons 160 in the conduction band 150 flow across the junction from the n-type material 120, while the holes 170 from the valence band 140 flow from the p-type material 120. As a result, a significant number of the electrons 160 and holes 170 recombine in the p-n junction. In order to enhance the recombination efficiency, an active layer 180 with lower bandgap $E_g^2$ 190 is often included at the center of the device. The lower bandgap in this so-called active layer 180 leads to efficient trapping of electrons and holes in the same spatial region and to more efficient recombination of electrons and holes. This type of device structure is called a double heterostructure. If the thickness of the active layer 180 is small enough for quantum mechanical confinement effects to be important, the active layer is called a quantum well.

The wavelength, and thus the color, of light emitted by an LED or laser diode depends on the bandgap of the active layer $E_g^2$. LEDs or laser diodes that emit light in the infrared or in the red-to-yellow spectrum have been available for many years. There has been great difficulty in developing semiconductor light emitters at shorter wavelengths. Extending LED light sources into the short-wavelength region of the spectrum, the region extending from green to violet, is desirable because LEDs can then be used to produce light in all three primary colors. Shorter-wavelength laser diodes will also permit the projection of coherent radiation to focus laser light into smaller spots. That is, in the optical diffraction limit, the size of a focused spot is proportional to the wavelength of the light. This allows high-density optical information to be stored and read out.

SUMMARY OF THE INVENTION

The invention is directed to nitride semiconductor films formed on substrates for use in short-wavelength visible light emitting optoelectronic devices, including light-emitting diodes (LEDs) and laser diodes (LDs).

This invention provides a zinc germanium nitride layer formed on a group III-V layer.

This invention provides a zinc germanium nitride (ZnGeN$_2$) layer, which is integrated with the group III-V nitride system and which provides a suitable bandgap for blue, green or even red light emission.

The invention further provides a light-emitting device with an active layer consisting of ZnGeN$_2$ confined between group III-V nitride layers.

The invention also provides other electronic devices, such as transistors or sensors which incorporate ZnGeN$_2$ with group III-V semiconductors.

Group III-V nitrides include elements from groups III and V of the periodic table. These materials are deposited onto substrates, forming layered structures for optoelectronic devices, including LEDs and laser diodes. The resulting devices can emit visible light over a wide range of wavelengths.

The performance of the optoelectronic devices depends on the quality of the group III-V nitride films formed on the substrates. An important factor affecting the quality is the lattice matching between the layers in the device structure.

ZnGeN$_2$ is almost lattice matched with GaN, and thus is a suitable candidate for integration with group III-V nitrides.

The group III-V nitride semiconductors, GaN, AlN and InN, are used as light emitters for optoelectronic device applications because these materials have the wide bandgap necessary for short-wavelength visible light emission. Group III-V nitrides also form strong chemical bonds which makes the material very stable and resistant to degradation under high electric current densities and intense light illumination. Most optoelectronic devices based on the group III-V nitride compounds require growth of a sequence of layers with different bandgaps. The bandgap of the active layer determines the wavelength of light emitted from a light-emitting diode or laser. In addition, the band discontinuity between layers with different bandgaps provides for optical and carrier confinement. To obtain layers with the bandgap around 2.7 eV, which will produce light in the blue region of the spectrum, InGaN alloys can be used. The bandgap of GaN is 3.4 eV and the bandgap of InN is 1.9 eV. In order to produce a group III-V alloy with a bandgap corresponding to visible light, an In content of 10% or higher is required.

Growing InGaN alloys with significant In content on GaN is difficult using conventional techniques, such as metal-organic chemical vapor deposition (MOCVD). One reason is a large lattice mismatch of over 10% between GaN and InN, which leads to large strains in InGaN grown on GaN. InGaN alloys also exhibit homogeneity and miscibility problems. In addition, the higher vapor pressure of InN complicates growth at high temperatures. Thus, group III-V alloys having In concentrations higher than 10% have been difficult to reproducibly achieve.

Thus, it would be advantageous if another material were available which could be integrated with group III-V nitrides and which provides a bandgap in the desired region for blue-light emission.

ZnGeN$_2$ has a bandgap of 2.7 eV, falling into a wavelength range suitable for light emission in the blue or blue-green region of the spectrum. The bandgap of ZnGeN$_2$ also provides a discontinuity of 0.7 eV, compared to GaN, which enables devices to take advantage of band offsets. ZnGeN$_2$ is also nearly lattice-matched with GaN, making it a suitable candidate for integration with group III-V nitrides. ZnGeN$_2$ has a monoclinic structure, which is of wurtzite-type, so that successful epitaxial growth on wurtzite-GaN is possible because of the close lattice match. The in-plane lattice constant of ZnGeN$_2$ is 3.17 Å, while the in-plane lattice constant of GaN is 3.19 Å. Thus, ZnGeN$_2$ and GaN have a lattice mismatch of less than 1%, which is a very small value in the nitride system.

Although light emission from a ZnGeN$_2$ active layer is expected to be blue, it may potentially also be in the blue-green spectrum. Various effects, such as, for example, strain, or if the emission is dominated by transitions between impurity levels some distance below the bandgap, can push the emission to longer wavelengths. Quantum confinement pushes the emission to shorter wavelengths.

The invention also incorporates by reference the subject matter of co-pending U.S. applications, application Ser. No. 09/127,038, filed Jul. 31, 1998, and application Ser. No. 09/160,324, filed Sep. 25, 1998.

These and other features and advantages of this invention are described in or are apparent from the following detailed description of the preferred embodiments.

BRIEF DESCRIPTION OF THE DRAWINGS

The preferred embodiments of this invention will be described in detail, with reference to the following figures, wherein.

DETAILED DESCRIPTION OF PREFERRED EMBODIMENTS

Figure 2:
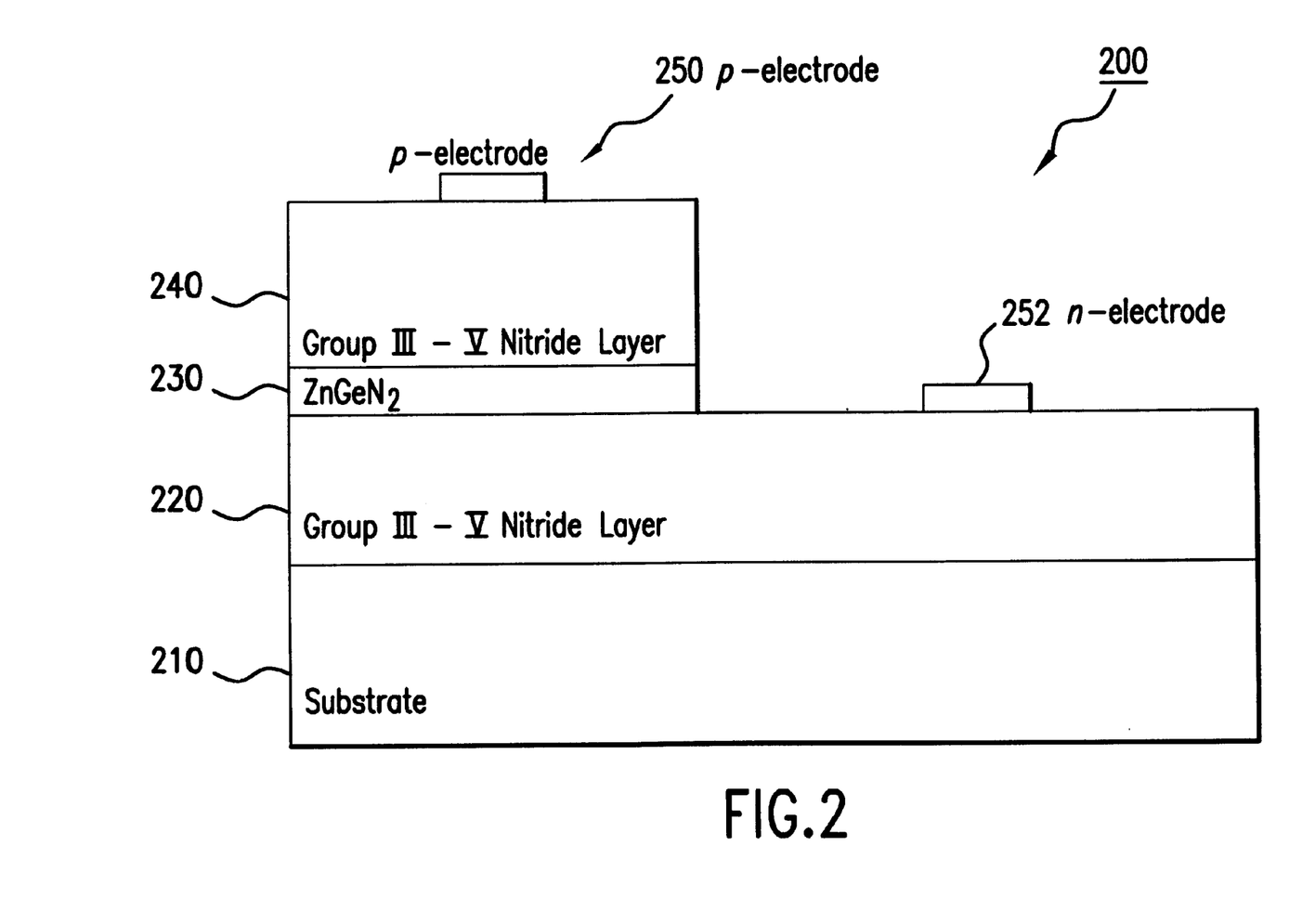
FIG. 2 shows the structure of a light-emitting device according to an embodiment of the invention.

FIG. 2 shows a multi-layered light-emitting device structure 200 according to an embodiment of the invention. The light-emitting device structure 200 includes a substrate 210, which may be formed by any known or later developed substrate material, such as, for example, sapphire or silicon carbide. In the case of sapphire, A and C-oriented single crystal sapphire is preferable for optoelectronic devices. A group III-V nitride layer 220 is formed over the substrate 210. Group III-V nitrides, such as GaN, InGaN, and AlGaN (which can be expressed by the general formula Al$_x$Ga$_{1-x}$N, where 0<x<0.4), have the characteristic wide bandgap necessary for short-wavelength visible-light emission. The group III-V nitride layer 220 shown in FIG. 2 is an n-type doped layer. A ZnGeN$_2$ layer 230 having a bandgap of approximately 2.7 eV is formed over the group III-V nitride layer 220. The ZnGeN$_2$ layer 230 is nearly lattice matched with GaN and is grown pseudomorphically on the group III-V nitride layer 220.

A second group III-V nitride layer 240 is then formed over the ZnGeN$_2$ layer 230. This second group III-V nitride layer 240 is a p-type doped layer. A p-electrode 250 is formed over the second group III-V nitride layer 240. An n-electrode 252 is formed over the group III-V nitride layer 220. The resulting structure shown in FIG. 2 thus includes the ZnGeN$_2$ layer 230, which is confined between the p-type group III-V layer 240 and the n-type group III-V layer 220. The ZnGeN$_2$ layer 230 is pseudomorphic with the group III-V nitride layers 220 and 240.

In operation, an electric current is applied through the p-electrode 250 and the n-electrode 252. Electrons in the conduction band flow from the n-doped group III-V nitride layer 220 to a lower energy state in the ZnGeN$_2$ layer 230. Current applied at the p-electrode 250 causes holes in the valence band of the p-doped group III-V nitride layer 240 to flow into the ZnGeN$_2$ layer 230. Thus, electrons from the n-doped group III-V layer 220 combine with holes from the p-doped group III-V layer 240 in the ZnGeN$_2$ layer 230. The ZnGeN$_2$ layer 230 is the active layer. Recombination of holes and electrons in the ZnGeN$_2$ active layer 230 results in the emission of light.

As is known in the art, multiple confinement and contact layers can be provided within the light-emitting device structure 200. Thus, the first and second group III-V nitride layers 220 and 240 are illustrative and are not meant to limit the number of group III-V layers which may be formed within the light-emitting device structure 200.

Figure 3:
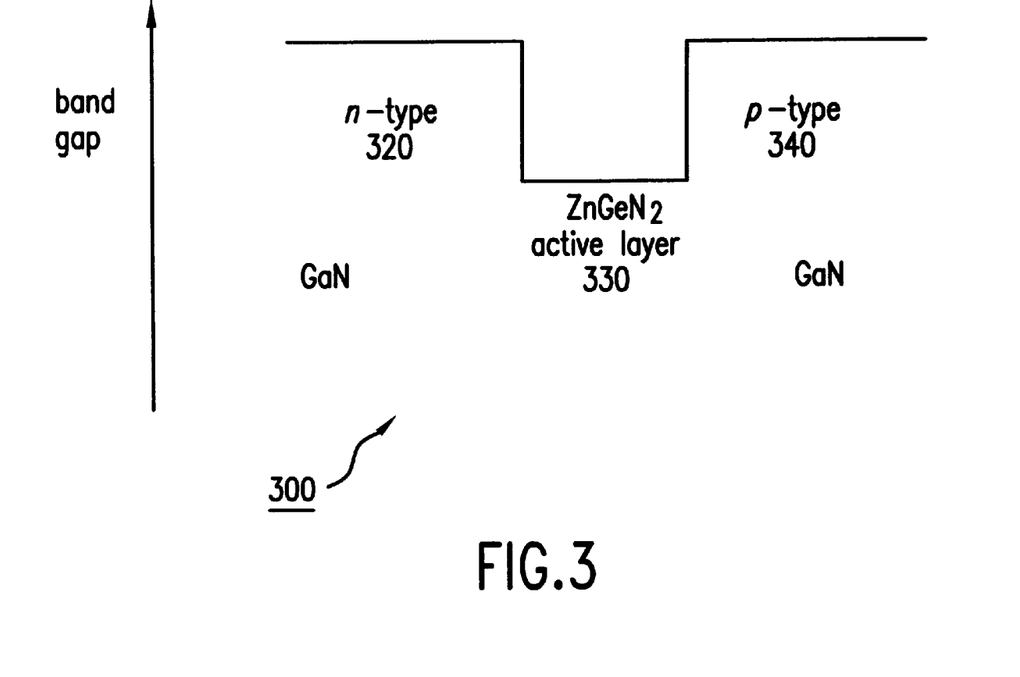
FIG. 3 shows the bandgap energy profile of the device shown in FIG. 2.

FIG. 3 shows a bandgap energy profile of a light-emitting device 300, such as an LED or laser diode, having a ZnGeN$_2$ active layer 330, emitting light in the blue region of the spectrum. The ZnGeN$_2$ active layer 330 is confined between an n-type GaN layer 320 and a p-type GaN layer 340. The n-type and p-type doped GaN layers 320 and 340 have a wide bandgap of approximately 3.4 eV. The ZnGeN$_2$ active layer has a lower bandgap of approximately 2.7 eV, which falls into the blue region of the spectrum. Light emission from the ZnGeN$_2$ active layer 330 is, therefore, expected in the blue region, but potentially also in the blue-green region, of the visible light spectrum.

The n-type GaN region 320 and the p-type GaN region 340 are regions of higher energy than the ZnGeN$_2$ active layer 330. Thus, the n-type GaN region 320 and the p-type GaN region 340 act as electrical confinement layers because the electrons and holes are injected from the higher-energy GaN regions 320 and 340 into a region of lower energy, the ZnGeN$_2$ active layer 330. The holes and electrons are injected through the n-type GaN region 320 and the p-type GaN region 340 into the lower energy ZnGeN$_2$ active layer 330 where they combine and emit light.

Figure 4:
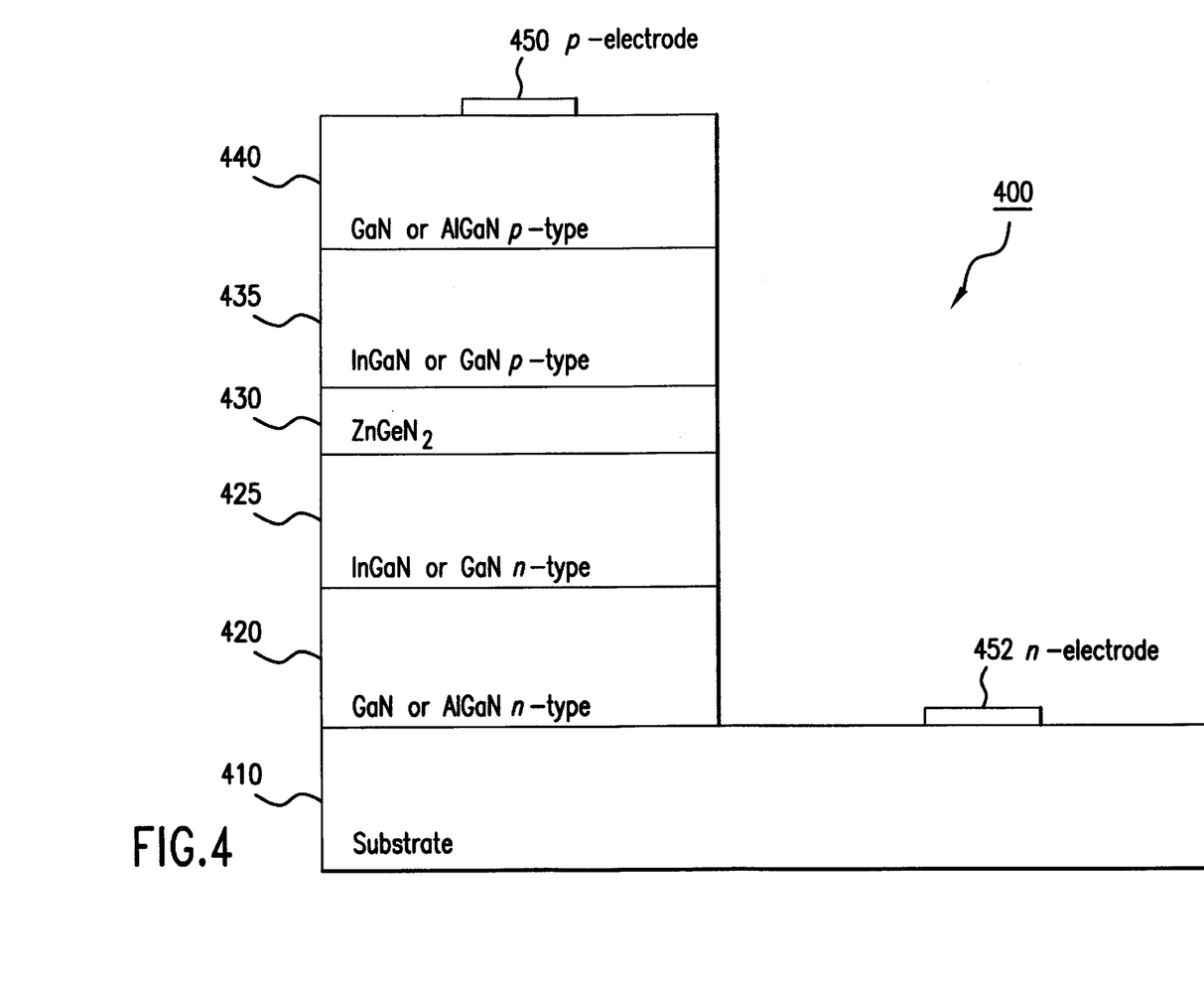
FIG. 4 shows the structure of a diode laser according to an embodiment of the invention.

FIG. 4 illustrates the structure of a laser diode 400, according to an embodiment of the invention. The laser diode 400 includes a substrate 410, which may be formed by any known or later developed substrate material, such as, for example, sapphire or silicon carbide. A group III-V nitride layer 420 is formed over the substrate 400. The group III-V nitride layer 420 may consist of GaN or an AlGaN alloy, and serves as a cladding layer for optical confinement of the laser mode(s). In embodiments, the cladding layers can have a thickness up to 2 $\mu$m. The group III-V nitride layer 420 is n-type doped. An intermediate GaN or InGaN layer 425 is formed over the group III-V nitride layer 420. The intermediate InGaN layer 425 is also n-type doped. A ZnGeN$_2$ layer 430 is then formed over the intermediate layer 425. A second intermediate GaN or InGaN layer 435 is formed over the ZnGeN$_2$ layer 430. The second intermediate InGaN layer 435 is p-type doped. Next, a group III-V nitride layer 440, consisting of GaN or AlGaN, is formed over the second intermediate InGaN layer 435. The group III-V nitride layer 450 is also p-type doped. A p-electrode 450 is formed over the group III-V nitride layer 440 and an n-electrode 452 is formed over the substrate 410.

The GaN or InGaN layers 425 and 435 are provided for optical and carrier confinement. Their bandgap is larger than the bandgap of the ZnGeN$_2$ active layer 430, leading to electrical confinement of carriers in the active layer 430. Simultaneously, the bandgap of layers 425 and 435 is lower than that of the cladding layers 420 and 440, ensuring confinement of the optical mode(s) in the central region of the device, consisting of layers 425, 430, and 435. For this reason the layers 425 and 435 are sometimes called waveguiding or optical guiding layers. In embodiments, the optical guiding layers can have a thickness of about 0.1 µm. The first and second intermediate layers 425 and 435 could consist of GaN, or potentially of InGaN (which can be expressed by the general formula $In_xGa_{1-x}N$, where 0<x<0.2). In case InGaN is used, the In content is lower than would be necessary if the InGaN layer was intended to operate as an active layer for blue light emission. Because of this lower In content, the intermediate InGaN layers 425 and 435 are easier to grow.

As in known in the art, multiple confinement and contact layers can be provided within the laser diode structure 400. Thus, the first, second, third and fourth group III-V nitride layers 420, 425, 435 and 440 are illustrative and are not meant to limit the number of group III-V nitride layers which may be formed within the laser diode structure 400.

In operation, current is applied through the p-electrode 450 and the n-electrode 452. When current is applied, electrons in the conduction band flow from the n-doped group III-V nitride layer 420 through the optical guiding layer 425 and into the $ZnGeN_2$ layer 430. Holes in the valence band flow from the p-doped group III-V layer 440 through the optical guiding layer 435 and into the $ZnGeN_2$ layer 430. Thus, electrons flow from the group III-V nitride layer 420 and holes flow from the group III-V nitride layer 440 into the $ZnGeN_2$ layer 430. The holes and electrons recombine in the active layer, in this case, the $ZnGeN_2$ layer 430. The recombination of electrons and holes results in the emission of light. Because the $ZnGeN_2$ active layer 430 has a bandgap of approximately 2.7 eV, light in the blue region of the spectrum is emitted.

Figure 5:
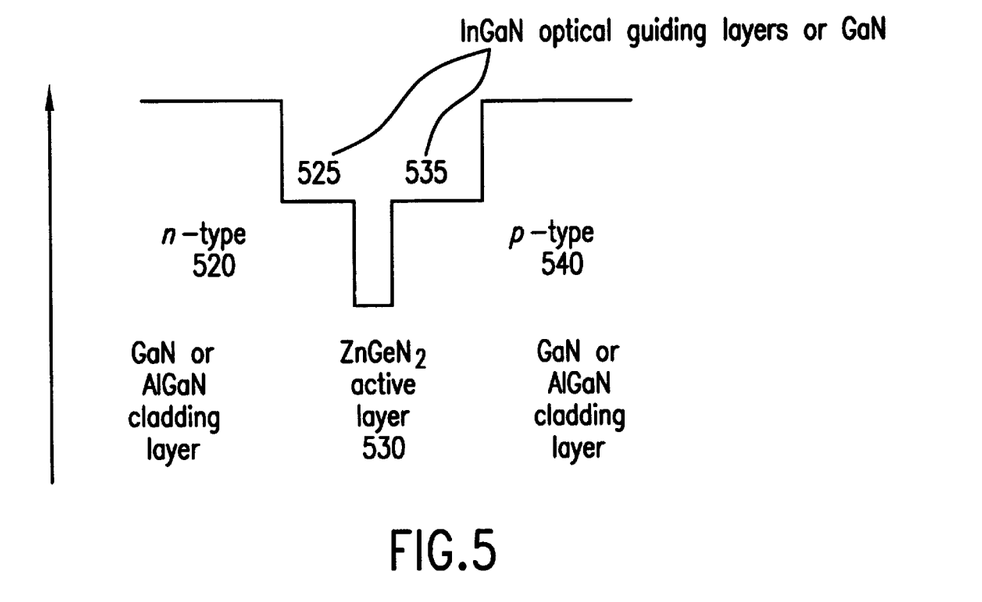
FIG. 5 shows the bandgap energy profile of the device shown in FIG. 4.

FIG. 5 shows a bandgap energy profile of the laser diode 400 having a $ZnGeN_2$ active layer or quantum well 530, the GaN or AlGaN cladding layers 520 and 540, and the GaN or InGaN optical guiding layers 525 and 535. As shown in FIG. 5, the n-type and p-type doped cladding layers 520 and 540 have the widest bandgap. The intermediate optical guiding layers 525 and 535 are disposed between the cladding layers 520 and 540 and the $ZnGeN_2$ active layer 530 and act as optical guiding layers. These intermediate layers 525 and 535 each have a smaller bandgap than the layers 520 and 540. Specifically, electrons and holes are shepherded by the intermediate InGaN layers 525 and 535 into the $ZnGeN_2$ active layer 530. The holes and electrons combine in the $ZnGeN_2$ active layer 530, resulting in the emission of light in the blue region of the spectrum.

It should be appreciated that while FIGS. 2 and 4 have been described with the n-type layers between the substrate and the $ZnGeN_2$ active layer, p-type layers could instead be between the substrate and the $ZnGeN_2$ active layer. It should also be appreciated that, while FIGS. 3 and 5 show the top and bottom group III-V layers being formed of the same material, the top and bottom group III-V layers can be formed of different materials.

The group III-V nitride layers, the $ZnGeN_2$ layers and the InGaN layers described in conjunction with the embodiments described above can be formed by conventional deposition techniques, including metal-organic chemical vapor deposition (MOCVD) and molecular-beam epitaxy. Those skilled in the art will appreciate the conditions under which these depositions are conducted.

The laser diode structure according to the invention described above can be applied to any device requiring compact laser structures, including high resolution laser printing devices, digital printers, display devices, projection displays, high density optical storage devices, including magneto-optical storage devices, including CD-ROM and DVD's whereby data is stored on a magneto-optical disk, fiber-optic communications devices, including fiber optic emitters and repeaters and undersea communications devices (sea water is most transparent in the blue-green spectrum). The LED structure according to the invention can also be applied to any device requiring compact LED structures, including illumination devices and full color displays, including monolithically integrated pixels for full color displays.

Figure 6:
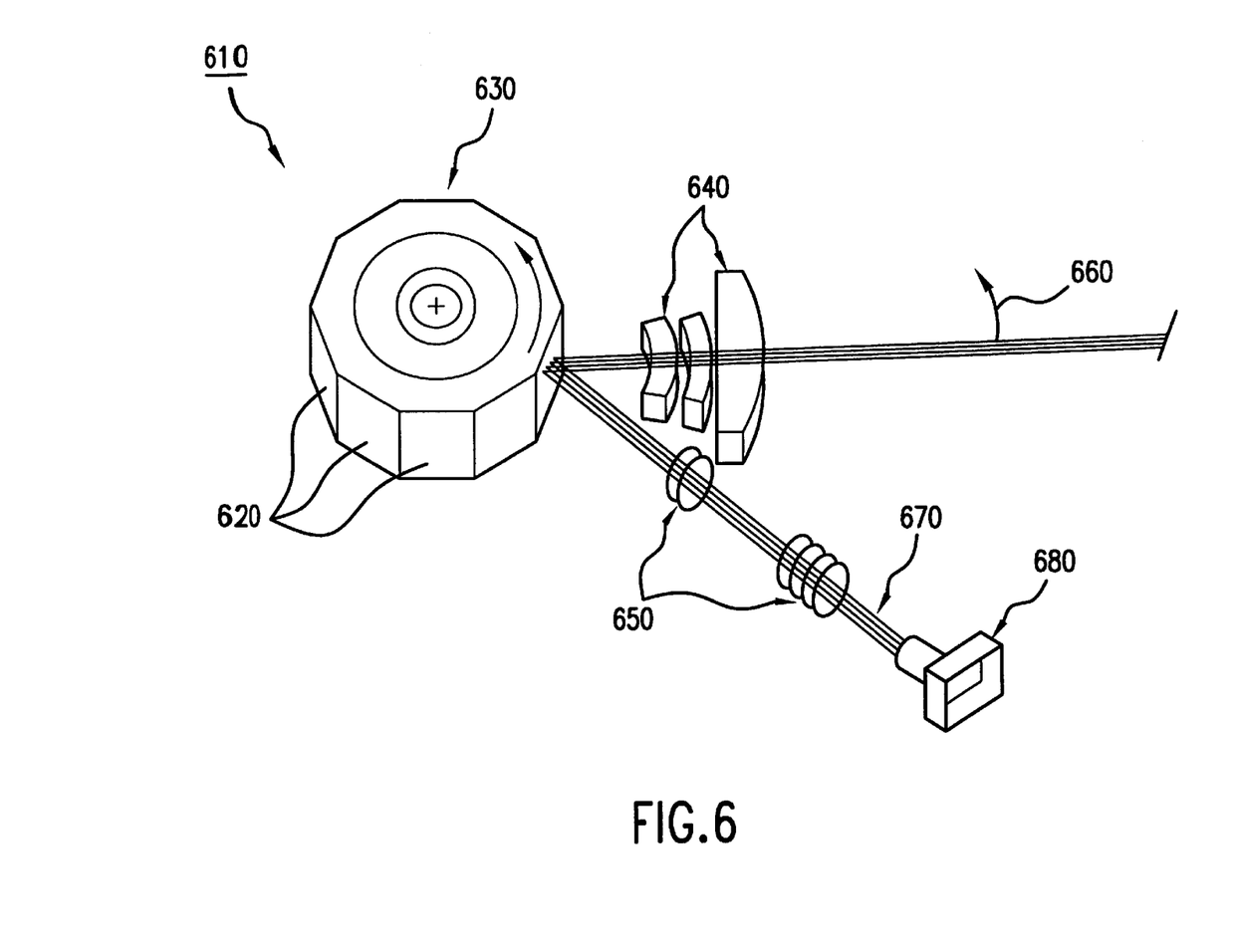
FIG. 6 shows the laser diode structure according to an embodiment of the invention incorporated into a reprographic printing system.

FIG. 6 shows the laser diode structure according to an embodiment of the invention implemented into a laser printing device. FIG. 6 shows a raster output scanner 610, which includes a laser source 680 that outputs multiple laser beams 670 from a substantially common spatial location. Each beam is independently modulated with data appropriate to expose a photoreceptive element in accordance with a desired image. An input optical system 650 serves to direct laser beams 670 onto overlapping co-axial optical paths such that they illuminate a rotating polygon 630 having a plurality of facets 620. The rotating polygon 630 repeatedly and simultaneously deflects the laser beams in the direction indicated by the arrow 660. The defected laser beams are input to a single set of imaging and correction optics 640, which focus the laser beams and correct for errors, such as polygon angle error and wobble. The laser diode structure according to the invention, such as, for example, the laser diode 400 shown in FIG. 4, may be incorporated into the laser source 680 in order to provide light in the blue-green emission spectrum.

While the invention has been described in conjunction with the specific embodiments described above, it is evident that many alternatives, modifications and variations are apparent to those skilled in the art. Accordingly, the preferred embodiments of the invention as set forth above are intended to be illustrative and not limiting. Various changes can be made without departing from the spirit and scope of the invention.

What is claimed is:

1. A semiconductor structure comprising:
    a substrate;
    at least one first nitride layer formed over the substrate;
    a zinc germanium nitride ($ZnGeN_2$) layer formed over the at least one first nitride layer; and
    at least one second nitride layer formed over the zinc germanium nitride layer.

2. The semiconductor structure according to claim 1, wherein the at least one first nitride layer and the at least one second nitride layer comprise at least one of GaN, InGaN or AlGaN.

3. The semiconductor structure according to claim 1, wherein the at least one first nitride layer is one of n-type doped and p-type doped, and the at least one second nitride layer is the other of n-type doped and p-type doped.

4. The semiconductor structure according to claim 1, wherein the at least one first nitride layer includes one nitride layer.

5. The semiconductor structure according to claim 1, wherein the at least one second nitride layer includes one nitride layer.

6. The semiconductor structure according to claim 1, wherein the semiconductor structure is an optoelectronic device.

7. The semiconductor structure according to claim 1, wherein the ZnGeN$_2$ nitride layer comprises an active layer.

8. The semiconductor structure according to claim 7, wherein the at least one first nitride layer and the at least one second nitride layer form confinement layers confining injected carriers into the active layer.

9. The semiconductor structure according to claim 1, wherein the semiconductor structure emits light in the blue region of the spectrum.

10. The semiconductor structure according to claim 1, wherein the semiconductor structure emits light with a wavelength within a range including 380 nm to 650 nm.

11. The semiconductor structure according to claim 1, further comprising electrodes providing electrical contacts to the at least one firat nitride layer and the at least one second nitride layer.

12. The semiconductor structure according to claim 1, wherein the zinc germanium nitride active layer has a thickness of about 1 to 50 nm.

13. The semiconductor structure according to claim 1, wherein the at least one first nitride layer and the at least one second nitride layer further comprise cladding layers expressed by the general formula $Al_xGa_{1-x}N$, where 0<x<0.4, the cladding layers having a thickness up to 2 $\mu$m.

14. The semiconductor structure according to claim 1, wherein the at least one first nitride layer and the at least one second nitride layer further comprise optical guiding layers expressed by the general formula $In_xGa_{1-x}N$, where 0<x<0.2, the optical guiding layers having a thickness of about 0.1 $\mu$m.

15. An image forming apparatus that forms an image on a light sensitive medium, the image forming apparatus including at least one light source that includes the semiconductor structure of claim 1.

16. The image forming apparatus according to claim 15, wherein the image forming apparatus includes at least one of a laser printer, a digital printer, a display device and an illumination device.

17. The image forming apparatus according to claim 15, wherein the at least one light source includes at least one raster output scanner and a multiple element print bar.

18. A data storage apparatus that stores data on a medium, the data storage apparatus including at least one light source that includes the semiconductor structure of claim 1.

19. The data storage device according to claim 18, wherein the data storage apparatus comprises a magneto-optical storage device.

20. The data storage device according to claim 18, wherein the data storage apparatus comprises any one of a CD-ROM drive and a DVD drive.

21. The data storage device according to claim 18, wherein the medium comprises a magneto-optical disk.

22. A communications apparatus that communicates information through a communications transmission medium, the communications apparatus including at least one light source that includes the semiconductor structure of claim 1.

23. The communications apparatus according to claim 22, wherein the communications apparatus comprises a fiber optic network.

24. The communications apparatus according to claim 22, wherein the at least one light source comprises at least one of a fiber optic emitter and a fiber optic repeater.

25. The semiconductor structure according to claim 1, wherein the at least one first nitride layer includes more than one nitride layer.

26. The semiconductor structure according to claim 1, wherein the at least one second nitride layer includes more than one nitride layer.

27. A method for forming a semiconductor structure, comprising:

forming at least one first nitride layer over a substrate;

forming a zinc germanium nitride (ZnGeN$_2$) layer over the at least one first nitride layer; and forming at least one second nitride layer over the ZnGcN, layer.

28. The method for forming a semiconductor structure according to claim 27, wherein the at least one first nitride layer and the at least one second nitride layer comprise at least one of GaN, InGaN and AlGaN.

29. The method of forming a semiconductor structure according to claim 27, wherein the at least one first nitride layer is one of n-type doped and p-type doped, and the at least one second nitride layer is the other of n-type doped and p-type doped.

30. The method of forming a semiconductor structure according to claim 27, wherein the ZnGeN$_2$ layer comprises an active layer.

31. The method of forming a semiconductor structure according to claim 27, comprising:

forming more than one first nitride layer over the substrate; and forming more than one second nitride layer over the ZnGeN$_2$ layer.

\* \* \* \* \*